(12) United States Patent
Dunne et al.

(10) Patent No.: US 7,842,909 B2
(45) Date of Patent: Nov. 30, 2010

(54) CMOS IMAGING DEVICE COMPRISING A MICROLENS ARRAY EXHIBITING A HIGH FILLING RATE

(75) Inventors: Brendan Dunne, Gardanne (FR); Caroline Fossati, Sorgues (FR); Olivier Gagliano, Marseilles (FR)

(73) Assignee: STMicroelectronics Rousset SAS, Rousset (FR)

( * ) Notice: Subject to any disclaimer, the term of this patent is extended or adjusted under 35 U.S.C. 154(b) by 74 days.

(21) Appl. No.: 12/129,096

(22) Filed: May 29, 2008

(65) Prior Publication Data

US 2008/0290383 A1 Nov. 27, 2008

Related U.S. Application Data

(63) Continuation-in-part of application No. PCT/FR2006/002581, filed on Nov. 24, 2006.

(30) Foreign Application Priority Data

Nov. 30, 2005 (FR) .................................. 05 12137

(51) Int. Cl.
  H01L 31/00 (2006.01)
  H01L 21/00 (2006.01)
(52) U.S. Cl. .................... 250/208.1; 348/340; 257/292; 438/69
(58) Field of Classification Search ............... 250/208.1; 348/340; 257/292; 438/69
  See application file for complete search history.

(56) References Cited

U.S. PATENT DOCUMENTS

| 5,536,455 | A | 7/1996 | Aoyama et al. |
| 6,301,051 | B1 | 10/2001 | Sankur |
| 6,582,988 | B1 | 6/2003 | Hsiao et al. |
| 2003/0021967 | A1 | 1/2003 | Sagiv et al. |
| 2005/0078377 | A1 | 4/2005 | Li et al. |
| 2005/0110104 | A1 | 5/2005 | Boettiger et al. |
| 2006/0027887 | A1 | 2/2006 | Boettiger et al. |
| 2006/0125947 | A1 * | 6/2006 | Packer et al. ................ 348/340 |

FOREIGN PATENT DOCUMENTS

| WO | 2006060298 A2 | 6/2006 |
| WO | 2006066081 A1 | 6/2006 |

OTHER PUBLICATIONS

Chou et al., "A novel method to fabricate gapless hexagonal microlens array," Sensors and Actuators A, vol. 118, 2005, pp. 298-306.

* cited by examiner

*Primary Examiner*—Seung C Sohn
(74) *Attorney, Agent, or Firm*—Lisa K. Jorgenson; Robert Iannucci; Seed IP Law Group PLLC

(57) ABSTRACT

A CMOS imager includes a photosite array and a microlens array. The microlens array comprises microlenses of a first type and microlenses of a second type, the microlenses of first type being manufactured according to a first circular template having a first radius, the microlenses of second type being manufactured according to a second circular template having a second radius inferior to the first radius, and the first and second templates having overlap areas. One advantage is that the CMOS imager has a high fill rate.

23 Claims, 14 Drawing Sheets

20

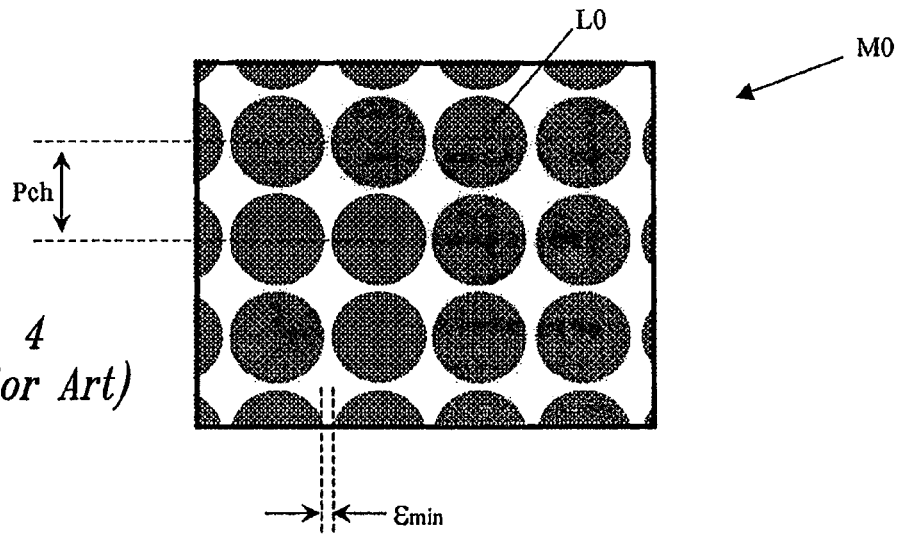
FIG. 4
*(Prior Art)*
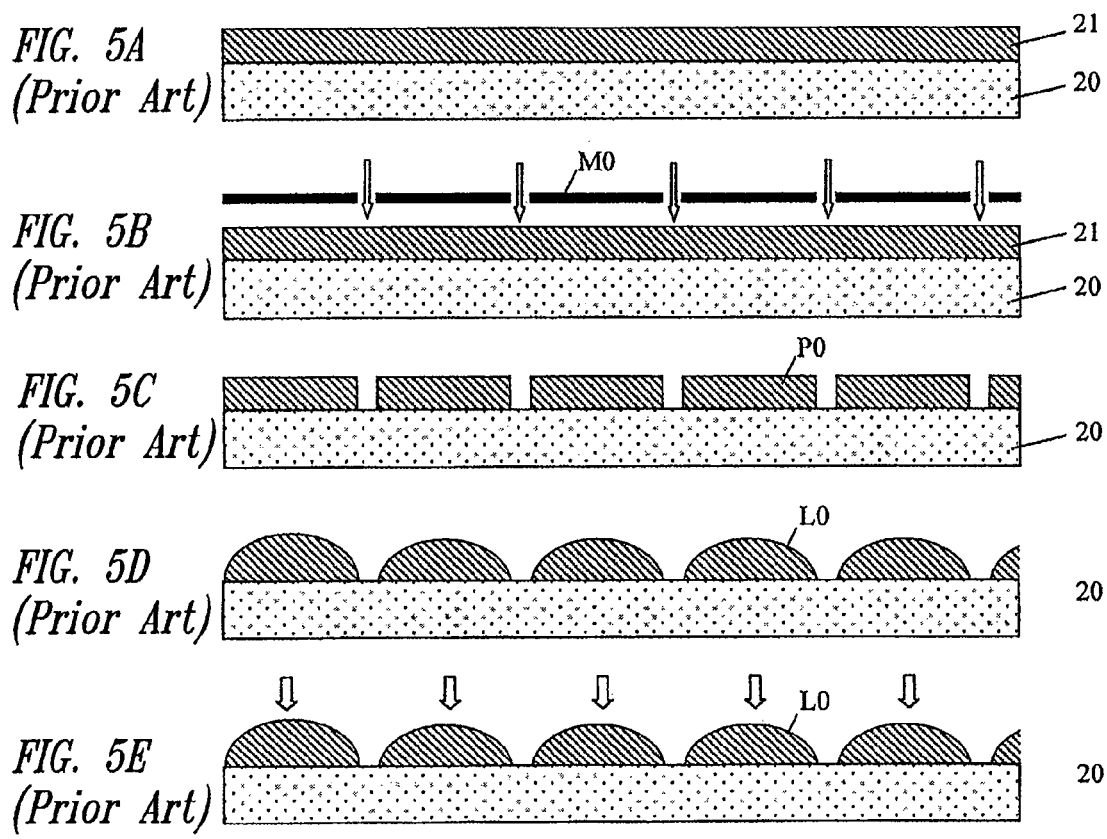
FIG. 5A *(Prior Art)*
FIG. 5B *(Prior Art)*
FIG. 5C *(Prior Art)*
FIG. 5D *(Prior Art)*
FIG. 5E *(Prior Art)*

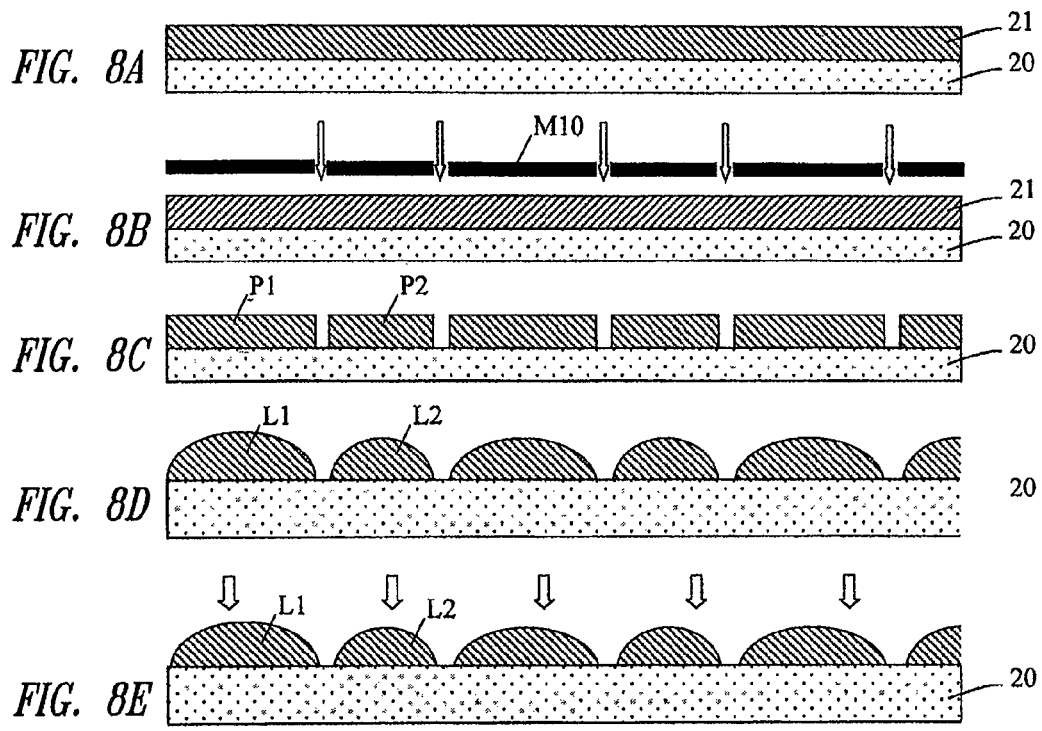
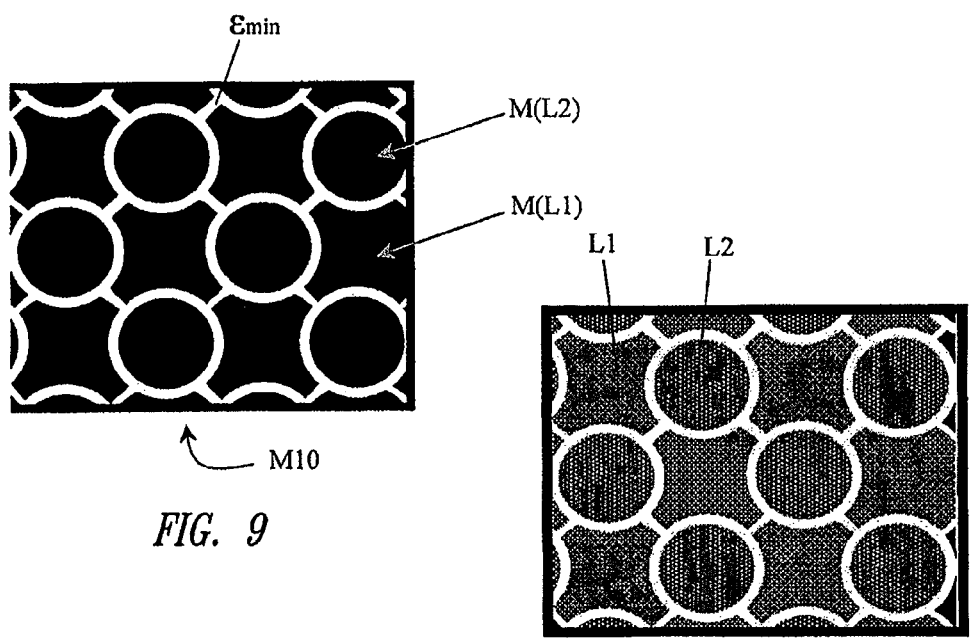
FIG. 9
FIG. 10

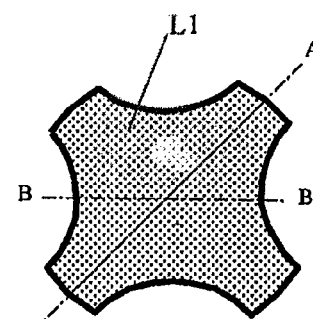
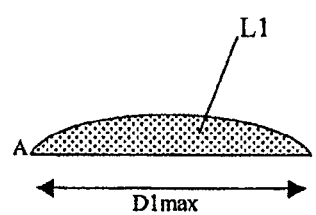
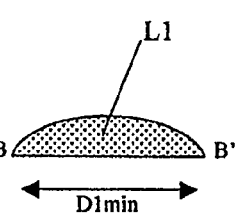
FIG. 11  FIG. 12A  FIG. 12B
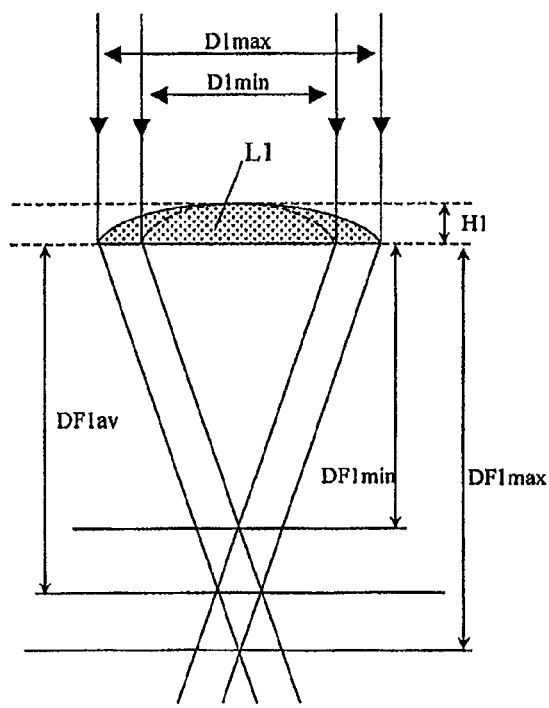
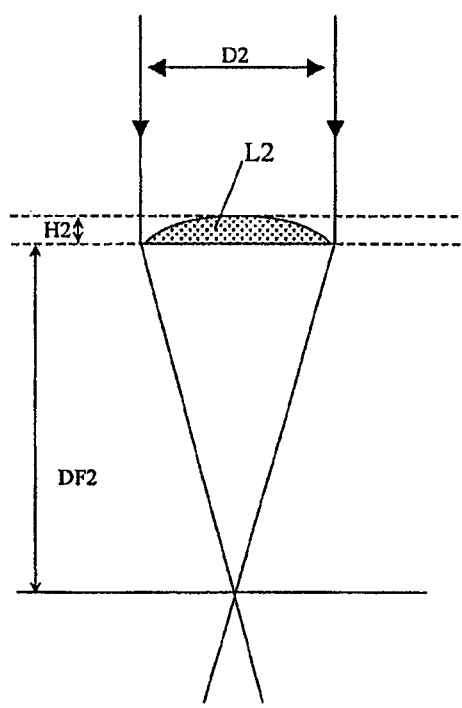
FIG. 13  FIG. 14

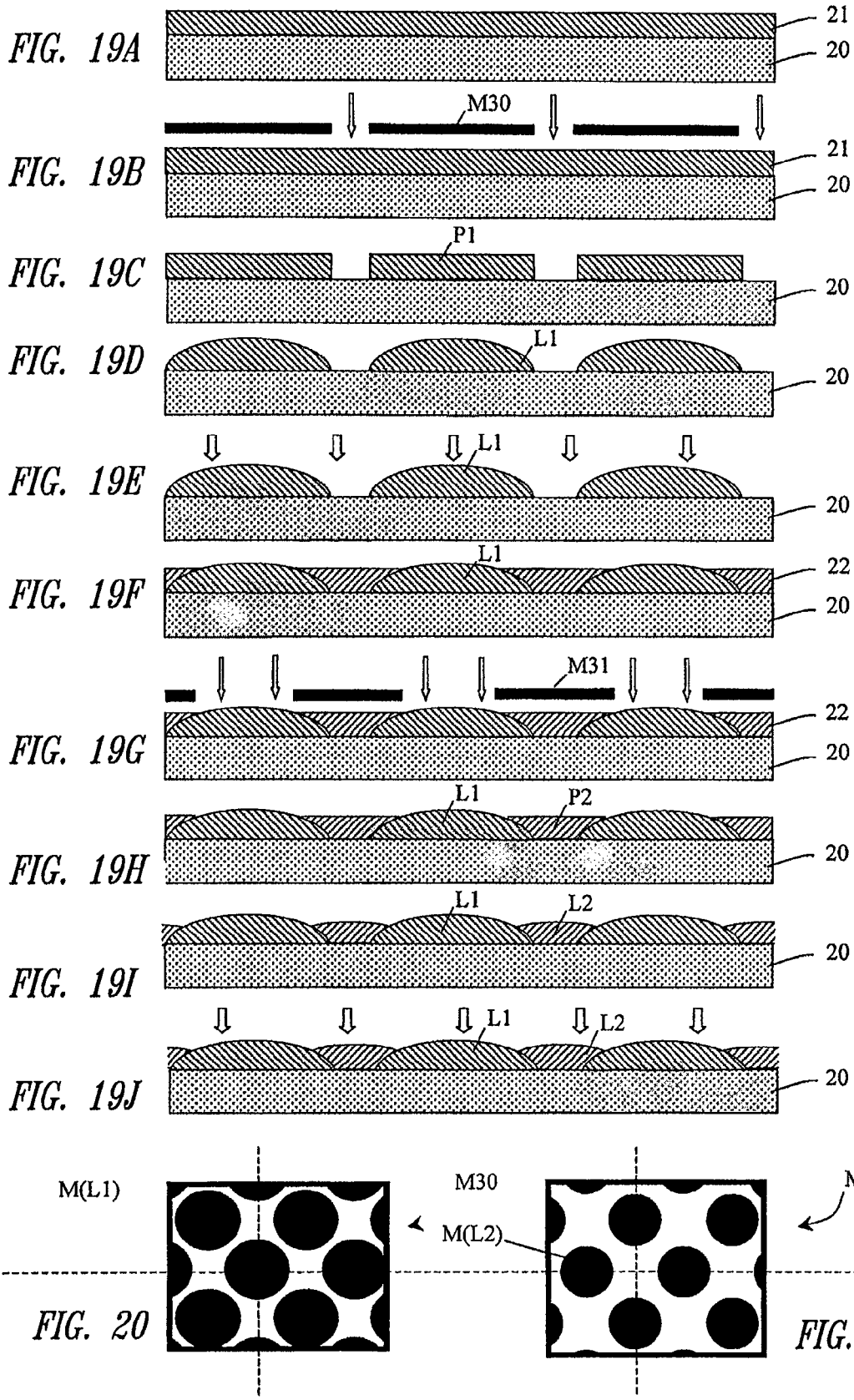

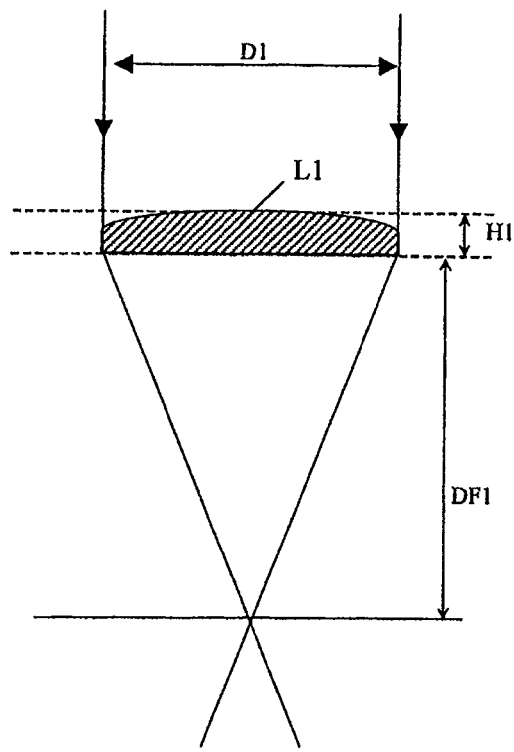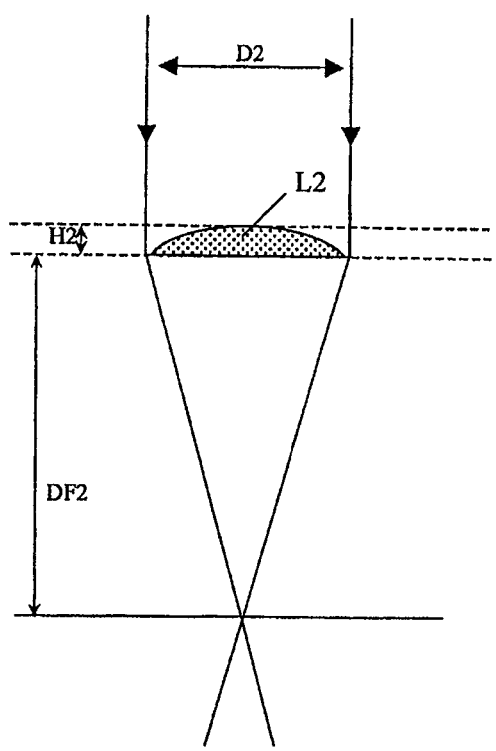
*FIG. 32*  *FIG. 33*

US 7,842,909 B2

CMOS IMAGING DEVICE COMPRISING A MICROLENS ARRAY EXHIBITING A HIGH FILLING RATE

CROSS-REFERENCE TO RELATED APPLICATION

This application is a continuation-in-part of International Patent Application No. PCT/FR2006/002581, filed Nov. 24, 2006, now pending, which application is incorporated herein by reference in its entirety.

This application claims the benefit under 35 U.S.C. § 119 (a) of French Patent No. 05 12137, filed on Nov. 30, 2005, which application is incorporated herein by reference in its entirety.

BACKGROUND

1. Technical Field

The present invention relates to CMOS imagers and more particularly to a structure of microlens array of CMOS imager and to a method for manufacturing this microlens array.

2. Description of the Related Art

Imagers manufactured according to the CMOS technology ("Complementary Metal Oxide Semiconductor") are currently used in an increasing number of applications due to their low cost price compared to CDD imagers (Charge Coupled Device). These CMOS imagers were initially used to manufacture low-resolution image sensors of poor quality (such as webcams). Today, after a significant investment in Research and Development, CMOS imagers can rival with CDD imagers. The present invention is part of the effort of improving this imager technology.

FIG. 1 shows an example module of picture and/or video frame grabbing using a CMOS imager, intended for example to be built into a portable device such as a mobile phone, a camera or a video camera. The module 1 comprises a frame 2, a lens holder block 3, lenses 4 attached to the block 3, an infrared filter 5 and a support 6. A CMOS imager 10 is arranged on the support 6 and receives the light passing through the microlenses and the infrared filter.

The CMOS imager 10 comes under the form of a semiconductor chip and comprises several photosites, each forming a pixel (not visible on FIG. 1). Each pixel comprises a photodiode and a circuit for controlling and interconnecting the photodiode. The pixels are arranged in a matrix way and a mosaic of red, green, blue filters spreads above the matrix of pixels, generally according to the Bayer architecture (the cells of a row being alternately red and green or alternately green and blue). Each pixel is thus covered by a filter of determined primary color—red, green or blue—and provides luminance information relating to the primary color allotted thereto, forming pixel information.

FIG. 2 is a schematic cross-sectional view of the CMOS imager 10 in a region corresponding to three pixels PIX1, PIX2, PIX3. From the bottom to the top, layers 11, 12, 13, 14, 15 and microlenses L0 (L0-1, L0-2, L0-3) can be seen. The layer 11 is the semiconductor substrate on which the imager is implanted. This layer 11 thus represents the active part of the imager and comprises photodiodes and their associated control and interconnection circuits (not detailed). The layer 12 is formed by a dielectric material which totally covers the substrate 11. The layer 13 is a passivation layer deposited on the imager at the end of the CMOS manufacturing process. The layer 14 is formed by colored resins and comprises red, green, or blue sectors 14-1, 14-2, 14-3 forming the aforementioned filters of primary color, on the basis of one colored filter by pixel. The layer 15 is an intermediary layer of resin forming a support for the microlenses L0 and offering a good flatness. The microlenses L0 are arranged in a Microlens Array called "MLA" on the basis of one microlens by pixel.

FIG. 3 is an exploded cross-sectional view of the imager 10 showing the structure of a pixel PIXi. The colored filter 14 and the microlens L0-i of the pixel are represented far from an active part 16 which is represented without its dielectric material so as to show components comprised therein. Thus, a photodiode 121 doped n+ formed above a well 11' doped d implanted in the substrate 11 is shown, together with elements forming the circuit for controlling and interconnecting the photodiode. These elements for example comprise an amplifier transistor 122, a column selection bus transistor 123, a reset transistor 124, and a row selection bus 125.

A distinctive feature of CMOS imagers, which is shown in FIG. 3, is that the photodiode occupies only a part of the total surface of the pixel, the remainder being occupied by the circuit for controlling and interconnecting the photodiode. For that reason, a CMOS pixel is generally called "active pixel", conversely to a pixel of CCD imager where the photodiode substantially occupies all the surface of a pixel. In practice, the photodiode generally occupies 50% of the surface of the pixel only.

The microlens L0 is used to collect and to focus on the photodiode 121 the photons received by the pixel. Without microlens, the yield of the imager (ratio between the received light energy and the light energy collected and transformed into electric voltage) would be poor and the supplied images would have a low brightness and a low contrast. Thus, the "fill factor" refers to the percentage between the effective surface of the pixel (surface of the photodiode) and the total surface of the pixel. The provision of a microlens array allows a higher fill factor to be obtained. The fill factor then corresponds to the ratio between the surface occupied by the microlenses and total surface of the active part of the imager, because all the light collected by the microlenses is assumed to be sent on the photodiodes.

A conventional structure of microlens array L0 is shown in top view in FIG. 4. The microlenses have a circular base and a constant diameter, and are spaced out between them by a centre-to-centre distance Pch called "pitch", corresponding to the pitch of the photodiode array. The nearest edges of the microlenses do not touch and are at a distance ∈. This distance is generally reduced to a minimum ∈min offered by the manufacturing method. By way of example, with the current photolithography methods, the minimum separating distance ∈min that must be respected is 0.4 µm. Thus, for a pitch of 4 mm, the maximum diameter of a microlens that can be chosen is 3.6 µm. Mathematically, taking into account the circular shape of the base of the microlenses, the fill factor obtained is therefore about 64%.

Thus, despite the provision of the microlens array, 36% of the surface of each pixel is lost, i.e. 36% of the total surface of the imager. This drawback is due to the circular shape of the base of the microlenses but also to the distance ∈min between the edges of the adjacent microlenses.

The conventional manufacturing method of this microlens structure is shown in FIGS. 5A to 5E and comprises the following steps:

depositing a layer of photosensitive polymer resin 21 (photoresin) on an imager wafer 20 and soft bake of the layer of resin (FIG. 5A), exposing the layer of resin 21 to an ultraviolet light through an insulation mask M0 (FIG. 5B), removing insulated parts from the layer of resin 21 with an organic solvent (FIG. 5C), to obtain an array of flat pellets P0, thermal creep of the pellets P0 to obtain microlenses L0 with a convex upper face (FIG. 5D), afterbake of the microlenses L0 to ensure their hardening (FIG. 5E).

The resin used is a positive resin, i.e. having a high solubility in presence of an adapted solvent (etching agent) after UV exposure. The insulation mask M0 thus has dark areas which shape is identical to the shape of the microlenses to be made, and transparent areas spreading between the dark areas, corresponding to the areas of resin to be removed. The minimum separating distance ∈min between the edges of the microlenses L0 corresponds to the minimum distance between the dark areas of the mask M0. Below this minimum distance, flashes appear on the edges of the pellets P0 which do not separate properly, causing distortions of microlenses shapes after the creeping step.

In conclusion, the drawback of the above described conventional structure of microlenses is to have a fill factor far from the 100% ideal value, on the one hand because of the circular shape of the microlenses that limit filling in, and on the other hand because of the minimum separating distance ∈min between the edges of microlenses.

BRIEF SUMMARY

One embodiment is a microlens array structure that offers a fill factor higher than that offered by conventional microlens arrays.

One embodiment is a method for manufacturing a microlens array in which the microlenses are arranged side by side without spacing between edges.

One embodiment is a CMOS imager comprising a photosite array and a microlens array, wherein the microlens array comprises microlenses of a first type and microlenses of a second type, the microlenses of first type are made according to a first circular template having a first radius, the microlenses of second type are made according to a second circular template having a second radius smaller than the first radius, and the first and second templates have overlap areas.

According to one embodiment, the overlap areas of the templates are occupied by the microlenses of second type, and the microlenses of first type have an octagonal base with rounded edges and do not occupy the overlap areas.

According to one embodiment, the microlenses of second type cover the microlenses of first type in the overlap areas of the templates.

According to one embodiment, the microlenses of first type are multifocal and the microlenses of second type are monofocal.

According to one embodiment, the microlenses of first type and of second type are monofocal.

According to one embodiment, the radiuses of the first and second templates are such that the surface of the first template minus the surface of the overlap areas is equal to the surface of the second template.

According to one embodiment, the microlenses of first type and the microlenses of second type are alternately distributed according to a constant pitch Pch, and the radius of the first template is equal to a value R1 complying with the following equation:

$$R1 = \frac{1}{2}(\sqrt{2}*Pch - \in),$$

where ∈ is a separation distance between the edges of two contiguous microlenses of first type.

According to one embodiment, the imager comprises between the closest edges of the microlenses of first type and the microlenses of second type, a separation distance equal to a tolerance of the manufacturing method of the imager.

According to one embodiment, the imager comprises between the closest edges of the microlenses of first type and the microlenses of second type, a separation distance equal to zero or lower than a tolerance of the manufacturing method of the imager.

One embodiment is a portable device, such as mobile phone, camera or video camera, comprising an imager.

One embodiment is a method for manufacturing a CMOS imager comprising a photosite array, the method comprising a step of manufacturing a microlens array on a face of the imager, the step of manufacturing the microlens array comprising a step of manufacturing microlenses of a first type and a step of manufacturing microlenses of a second type, the microlenses of first type being made according to a first circular template having a first radius, the microlenses of second type being made according to a second circular template having a second radius smaller than the first radius, and the first and second templates have overlap areas.

According to one embodiment, the microlenses of first type are made so as to have an octagonal base with rounded edges and do not spread into the overlap areas of the first and second templates.

According to one embodiment, the method comprises a step of manufacturing resin pellets having an octagonal outline with rounded edges, and a step of creeping the pellets to obtain microlenses of first type.

According to one embodiment, the method comprises a step of manufacturing microlenses of first type having a circular outline, and a step of etching the microlenses of first type so that the microlenses of first type have an octagonal base with rounded edges.

According to one embodiment, the microlenses of second type are made after the microlenses of first type and cover the microlenses of first type in the overlap areas of the templates.

According to one embodiment, the method comprises a step of previously calculating the radiuses of the first and second templates, so that the surface of the first template minus the surface of the overlap areas is equal to the surface of the second template.

According to one embodiment, the microlenses of first type and the microlenses of second type are alternately distributed according to a constant pitch Pch, and the method comprises a step of determining a radius R1 of the first template complying with the following equation:

$$R1 = \frac{1}{2}(\sqrt{2}*Pch - \in),$$

where ∈ is a distance between the edges of two contiguous microlenses of first type.

According to one embodiment, the step of manufacturing microlenses of first type and the step of manufacturing microlenses of second type are simultaneous.

According to one embodiment, the method comprises the steps of depositing a layer of resin on an imager wafer, insulating the layer of resin through an insulation mask, removing the insulated parts from the layer of resin, to obtain resin pellets of a first type and of a second type, and thermal creep of the pellets of first type and of second type, to obtain microlenses of first type and of second type According to one embodiment, the step of manufacturing microlenses of second type is performed after the step of manufacturing microlenses of first type.

According to one embodiment, the method comprises the steps of depositing a first layer of resin on an imager wafer, insulating the first layer of resin through a first insulation mask, removing the insulated parts from the layer of resin, to obtain resin pellets of a first type, thermal creep of the pellets to obtain microlenses of first type, depositing a second layer of resin on the imager wafer, insulating the second layer of resin through a second insulation mask, removing the insulated parts from the layer of resin, to obtain resin pellets of a second type, and thermal creep of the pellets of second type to obtain the microlenses of second type.

According to one embodiment, the first insulation mask is shaped so that the resin pellets of first type have an octagonal outline with rounded edges.

According to one embodiment, the method comprises the steps of depositing a first layer of resin on an imager wafer, insulating the first layer of resin through a first insulation mask, removing the insulated parts from the layer of resin, to obtain resin pellets of a first type having a circular outline, thermal creep of the pellets to obtain microlenses of first type having a circular base, etching the microlenses of first type so that the microlenses of first type have an octagonal base with rounded edges, depositing a second layer of resin on the imager wafer, insulating the second layer of resin through a second insulation mask, removing the insulated parts from the resin, to obtain resin pellets of a second type, and thermal creep of the pellets of second type to obtain the microlenses of second type.

According to one embodiment, the step of etching the pellets of first type is performed by means of a gaseous plasma.

According to one embodiment, the step of etching the pellets of first type is performed through an etching mask formed by depositing a layer of masking resin on the imager wafer, insulating the layer of masking resin through an insulation mask, and removing the insulated masking resin, to obtain the etching mask.

BRIEF DESCRIPTION OF THE SEVERAL VIEWS OF THE DRAWINGS

Advantages and features of the present invention will be presented in greater detail in the following description of a microlens array according to one embodiment and of various manufacturing methods of this microlens array, given in relation with, but not limited to the following figures:

FIGS. 8A to 8E are cross-sectional views showing a first method for manufacturing the microlens array of FIG. 6, FIG. 9 shows an insulation mask used by the first method, FIG. 10 is a top view of a microlens array made according to the first method, FIG. 11 is a top view of a microlens of first type and FIGS. 12A, 12B are cross-sectional views of this microlens according to two different section axes, FIG. 13 shows optical properties of a microlens of first type made according to the first method, FIG. 14 shows optical properties of a microlens of second type made according to the second method, FIGS. 19A to 19J are cross-sectional views showing a third method for manufacturing the microlens array of FIG. 6, FIGS. 20 and 21 show insulation masks used by the third method, FIG. 32 shows optical properties of a microlens of a first type made according to the fourth method, FIG. 33 shows optical properties of a microlens of a second type made according to the fourth method.

DETAILED DESCRIPTION

Structure of a Microlens Array According to One Embodiment

Figure 6:
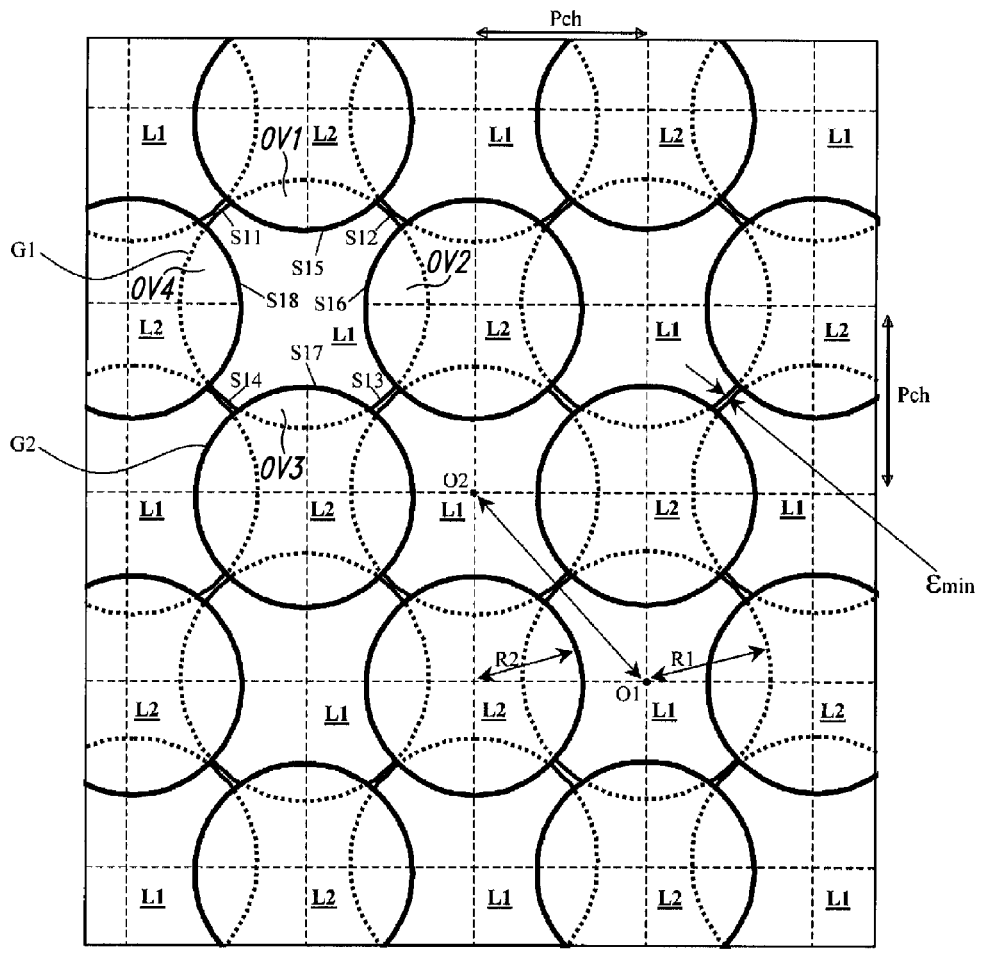
FIG. 6 is a top view of a microlens array according to one embodiment, comprising microlenses of a first type and of a second type.

FIG. 6 is an abstract representation of a microlens array according to one embodiment, in top view. The shape of the microlenses in top view corresponds to the shape of the microlenses bases. The array comprises microlenses of a first type L1, or microlenses L1, made according to a first template G1, and microlenses of a second type L2, or microlenses L2, made according to a second template G2. The templates are shown in dotted lines whereas the microlenses bases are shown in continuous lines.

The microlens array has the following general features:
the templates G1 and G2 are circles of radiuses R1 and R2 and are alternately arranged according to rows and columns of the array, indicated by horizontal and vertical dotted lines forming a network,
the distance between the center of a microlens L1 and the center of an adjacent microlens L2 is equal to the pitch Pch of the photosite (pixel) array of the corresponding CMOS imager, which is therefore the pitch of the microlens array too, the sum of the radiuses R1 and R2 is higher than the pitch Pch, so that the templates G1 and G2 have overlap areas OV1, OV2, OV3, and OV4, for example, as shown in the figure, the base of the microlenses L2 has a shape corresponding to the template G2 (the dotted lines of the template G2 thus being covered by the continuous lines representing the microlenses L2), the base of the microlenses L1 has a shape which delimits an area corresponding to the area covered by the template G1, from which the overlap areas with the template G2 of the adjacent microlenses L2 are subtracted (four overlap areas for each microlens L1).

The result is that the base of the microlenses L1 has an "octagonal shape with rounded edges" having four positively curved edges S11, S12, S13, S14 corresponding to angular sectors of the template G1 and four negatively curved edges S15, S16, S17, S18 corresponding to angular sectors of the templates G2 of the adjacent microlenses L2.

Determining the Templates G1, G2

According to one embodiment, the active surfaces (real surfaces) of the microlenses L1 and L2 are chosen to be identical, so that the photosites covered by the microlenses L1 receive the same quantity of light as the photosites covered by the microlenses L2 (in same illumination conditions). Thus, the radiuses R1, R2 of the templates are preferably determined so that the active surfaces of the microlenses L1, L2 are equal. To that purpose, the radius R1 is calculated at first and the radius R2 is then determined according to R1.

R1 Calculation

[O1 O2] refers to the distance between the centers O1 and O2 of two adjacent microlenses L1, i.e. two microlenses of same type belonging to two adjacent rows and two adjacent columns. The distance [O1 O2] is equal to the diagonal of the network of the array, that is:

$$[O1\ O2] = \sqrt{[Pch^2 + Pch^2]} \quad (1)$$

In addition, the radius R1 of the template G1 obeys the relation:

$$2R1 + \in = [O1\ O2] \quad (2)$$

where $\in$ is the distance between the edges of two adjacent microlenses L1.

The following relation is deduced combining (1) and (2):

$$R1 = \tfrac{1}{2}(\sqrt{2} * Pch - \in) \quad (3)$$

By decreasing the distance $\in$ to the minimum value $\in$min imposed by the manufacturing method (tolerance of the method), to obtain the highest fill factor, it results that the radius R1 is equal to:

$$R1 = \tfrac{1}{2}(\sqrt{2} * Pch - \in min) \quad (4)$$

Thus, for example, if the pitch Pch is equal to 4 µm and $\in$min is equal to 0.4 µm, the radius R1 is equal to 2.63 µm.

R2 Calculation

Figure 7:
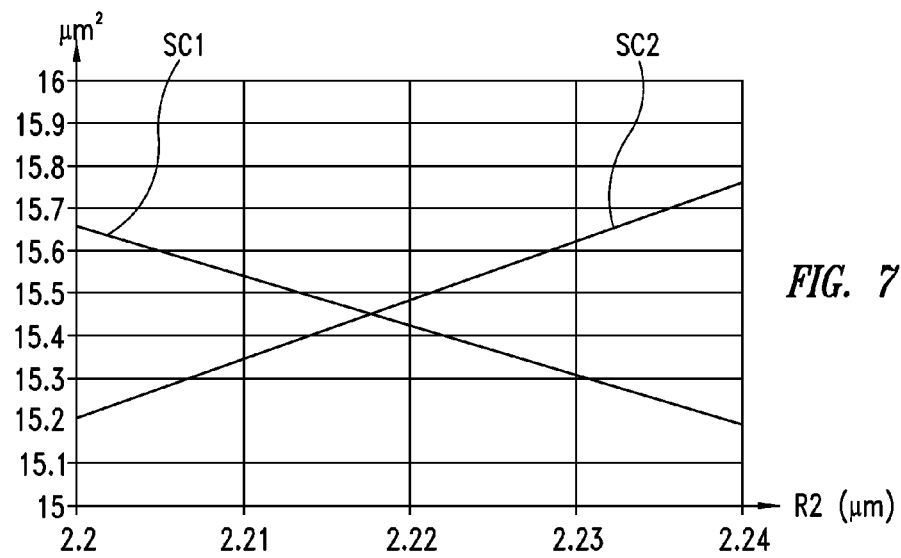
FIG. 7 is a graph showing a step of determining the radius of the microlenses of second type.

The radius R1 being known for known values of Pch and $\in$min, the equation of identity of the surfaces of the microlenses of L1 type and L2 type can be solved using the graph shown in FIG. 7. The abscissa axis of the graph is graduated in µm and the ordinate axis is graduated in µm² (square micrometers). A curve SC2 representing the value of the surface of microlenses L2 when R2 increases, and then a curve SC1 representing the surface of the microlenses L1 according to R2 (R1 is constant) are drawn. This surface decreases when R2 increases because it is equal to the area of the template G1 minus the area of the overlap areas, that increases when R2 decreases. Thus, both curves have a point of intersection that corresponds to the point of identity of the surfaces of the microlenses L1 and L2. The abscissa of the point of intersection is the desired value of R2. For example, here the radius R2 must be equal to about 2.22 µm when R1=2.63 µm for the surfaces of the microlenses L1, L2 to be equal. In practice, the radius R2 can also be determined using an optical simulation software comprising algorithms for calculating surfaces of microlenses, such as a ZEMAX simulator.

This structure of the microlens array has the advantage of offering a high fill factor (useful surface of the microlens array in relation to the total surface of the array). The microlenses L1 can be monofocal (little point of light on the corresponding photodiode) or multifocal (spot of light on the photodiode), whereas the microlenses L2 are preferably monofocal.

Figure 1:
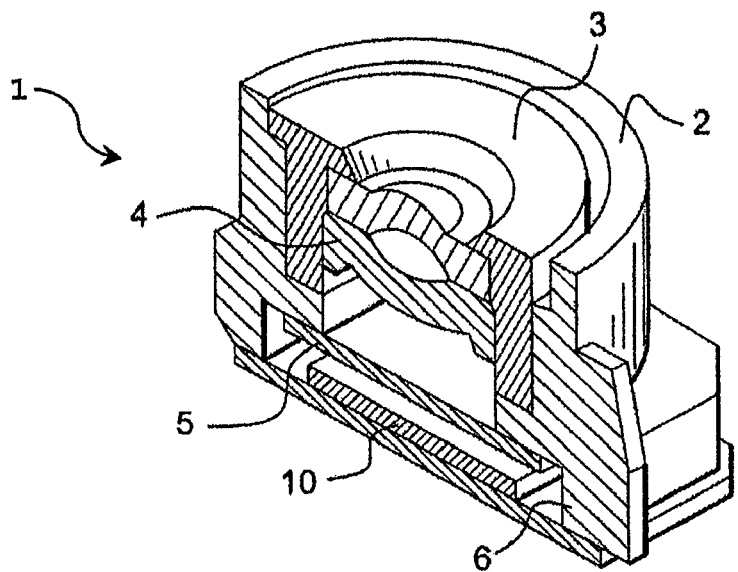
FIG. 1 previously described shows a frame grabbing module using a CMOS imager.
Figure 2:
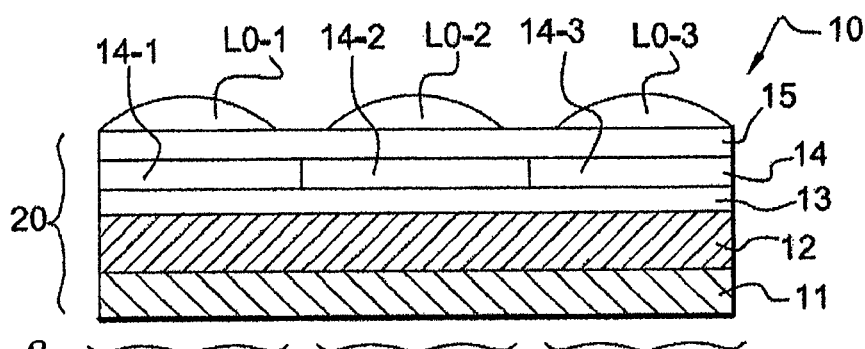
FIG. 2 previously described is a schematic cross-sectional view of the CMOS imager, FIG. 3 previously described is an exploded view of a pixel of the CMOS imager, FIG. 4 previously described is a top view of a conventional microlens array for CMOS imager, FIGS. 5A to 5E previously described show a conventional method for manufacturing the microlens array of FIG. 4.
Figure 3:
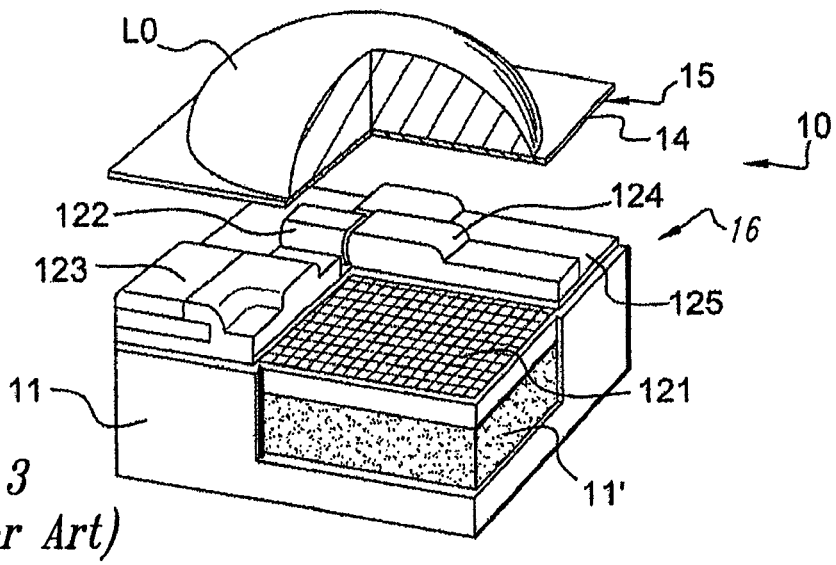

Preferably, the focal length of the microlenses L1 must be substantially equal to that of the microlenses L2 and this common focal length must correspond to the distance between the microlens array and the photodiode array (thickness of the layers 12, 13, 14 and 15 in FIG. 2). The focal length being a function of the radius of the microlenses and of their height, the microlenses L1 of first type and the microlenses L2 of second type are not of the same height in principle if their respective focal lengths are equal. For example, monofocal microlenses L1 of radius R1=2.63 µm and monofocal microlenses L2 of radius R2=2.22 µm must have respective heights H1=930 nm and H2=672 nm to obtain an identical focal length of about 8 µm. However, a compromise can be reached and an example embodiment of microlenses L1, L2 of identical heights will be described hereinafter.

Finally, if the microlenses L1 are made multifocal, the height of the microlenses L1 is determined so that the average focal length of the lens (average between the smallest focal length and the greatest focal length) is preferably equal to the distance between the microlens array and the photodiode array, to avoid the spot of light from extending beyond the photodiodes regions.

Manufacture of the Microlens Array

Four exemplary methods for manufacturing a microlens array will be described hereinafter. The four methods will be referred to as "method 1", "method 2", "method 3" and "method 4" and will be respectively illustrated by the groups of FIGS. 8A-8E, 15A-15J, 19A-19J and 27A-27O.

In these various methods, the microlens array is made on an imager wafer which is schematically shown by a layer 20. This layer 20 comprises the layers 11 to 15 shown in FIG. 2, the layer 11 (substrate and components) forming the active part of the imager.

Although the aforementioned figures only illustrate the formation of a few microlenses of the array, the methods 1 to 4 are used to collectively manufacture several imagers on a silicon wafer which is then cut to obtain individual imager chips.

Each method comprises steps of depositing and soft baking of one layer or two layers of resin, insulating the layer(s) of resin through an insulation mask (positive resin), removing the insulated parts from the resin, creeping the resin remaining on the imager wafer and hardening the resin. These steps can be conventionally implemented regarding the parameters of the process. Thus, the steps of depositing the layers of resin can be performed by depositing a quantity of positive resin at the center of the imager wafer 20 and spreading the resin on the wafer by centrifugation. The soft bake steps can be performed during some tens of seconds at a temperature of about 100° C. The insulation steps can be implemented with an ultraviolet light during a time corresponding to the transfer of photonic energy of about 300 mJ. The steps of removing the insulated resin can comprise dipping the layer of resin in an organic solvent bath at a determined temperature (for example 23°) for a duration of about some tens of seconds (for example 80 s). The creeping steps can be performed by exposing the resin to a temperature of about 200° C. to 240° C. during some tens of seconds (for example 30 to 60 s). At last, the hardening steps are steps of microlens afterbake, during a few minutes and at a temperature of about 200° C.

Method 1, FIGS. 8A to 8E

This method uses one insulation mask M10 only, shown in FIG. 9 (partial view) comprising dark areas M(L1) of octagonal shape with rounded edges, and circular dark areas M(L2) for etching a layer of resin 21 and simultaneously manufacturing microlenses of L1 type and L2 type. The minimum distance between the dark areas of the mask M10, for example 0.4 µm, is imposed by the method and defines the minimum distance ∈min between two microlenses (edge to-edge distance).

The method 1 more particularly comprises the following steps:
  depositing the layer of resin 21 on the imager wafer 20 and soft bake of the layer of resin (FIG. 8A),
  exposing the layer of resin to an UV light through the mask M10 (FIG. 8B),
  removing the insulated parts from the layer of resin 21, to obtain resin pellets of a first type P1 and of a second type P2 (FIG. 8C),
  thermal creep of the pellets P1 and P2 to obtain microlenses of first type L1 and of second type L2 (FIG. 8D),
  hardening the microlenses L1, L2 (FIG. 8E).

FIG. 10 is a top view of the obtained microlens array (partial view). The base of the microlenses of L1 type has an octagonal shape with rounded edges as described above, whereas the base of the microlenses L2 has the circular shape also described above (Cf. calculation of R1 and R2). These octagonal and circular shapes are here given to the pellets P1 and P2 at the time of etching the layer of resin (FIG. 8C), and define the shape of the base of the microlenses after the upper face of the pellets has "swollen" under the effect of creep to form the convex upper face of the microlenses. The dark areas of the mask M10 thus have the same shape as that of the pellets P1, P2 due to the use of a positive resin.

The pellets P1 having an octagonal shape with rounded edges and the pellets P2 having a circular shape, the microlenses L1 obtained after creeping the pellets P1 are multifocal whereas the microlenses L2 are monofocal. This will be better understood by referring to FIGS. 11 to 14.

FIG. 11 shows a microlens of L1 type in top view, FIG. 12A shows the microlens L1 in cross-sectional view according to an axis AA' shown in FIG. 11 and FIG. 12B shows the microlens L1 according to an axis BB' also shown in FIG. 11. The axis AA' is an axis of greatest diameter of the microlens L1 and along which the microlens has a diameter D1 max. The axis BB' is an axis of smallest diameter of the microlens L1, and along which the microlens has a diameter D1min. Thus, as shown in FIG. 13, the microlens L1 is the equivalent of several microlenses of different diameters, each microlens having a determined focal length comprised between a minimum focal length DF1min corresponding to the smallest diameter D1min and a maximum focal length DF1max corresponding to the greatest diameter D1max. The microlens L1 has an average focal length DF1$av$ (average of focal lengths) which preferably corresponds to the distance between the microlens array and the photodiode array of the imager, so that the spot of light provided by the microlenses does not go beyond the regions of photodiodes. Conversely, as shown in FIG. 14, a microlens L2 has only one focal length DF2 which should also correspond, preferably, to the distance between the plane of the microlens array and the plane of the photodiode array of the imager.

For the average focal length DF1$av$ of the microlenses L1 to be equal to the focal length DF2 of the microlenses L2, the microlenses L1 should be of a determined height H1 and the microlenses L2 of a height H2 different from H1. These heights vary with the thickness of the layer of resin before etching, that is the height of resin pellets before creep. The relation between the height of pellets and the thickness of microlenses is given by abacuses supplied by the resin manufacturer or established by experimentations. However, the microlenses L1 and L2 here being made from the same layer of resin, it will be beneficial to reach a compromise. For example, the thickness of the layer of resin is chosen so that the difference between the real height of microlenses L1 and the theoretical value H1 is approximately equal to the difference between the real height of the microlenses L2 and the theoretical value H2.

Because of the distance ∈min that must be respected between the edges of adjacent microlenses of the same type or of different type, the fill factor obtained when implementing the method 1 is about 80%.

Methods 2 to 4

The methods 2 to 4 which are now going to be described, advantageously have the following features:
  use of two layers of resin for a differentiated control of the heights of the microlenses of L1 type and of the microlenses of L2 type,
  suppression of the distance ∈min between the edges of the adjacent microlenses of L1 type and L2 type and obtaining a fill factor of about 96%,
  obtaining monofocal microlenses of L1 type (methods 3 and 4 only).

Although obtaining monofocal microlenses L1 is here presented as an advantage, the manufacture of multifocal microlenses L1 (method 1 and method 2) is not necessarily a drawback for implementing the invention, the main thing being that the spots of light obtained with multifocal microlenses do not spread beyond photodiodes regions. Thus, in practice, the choice of the best method will depend on characteristics and performance of the equipment of photolithography used, and on the cost price of the microlenses. It will be possible to reach a compromise between the precision of the method (distribution of the microlenses characteristics), the type of microlenses obtained (multifocal or monofocal) and the cost price of microlenses, also taking into account the target applications (quality imagers or "bottom-of-the-range" imagers).

Method 2, FIGS. 15A to 15J

Figures 16, 17, 18:
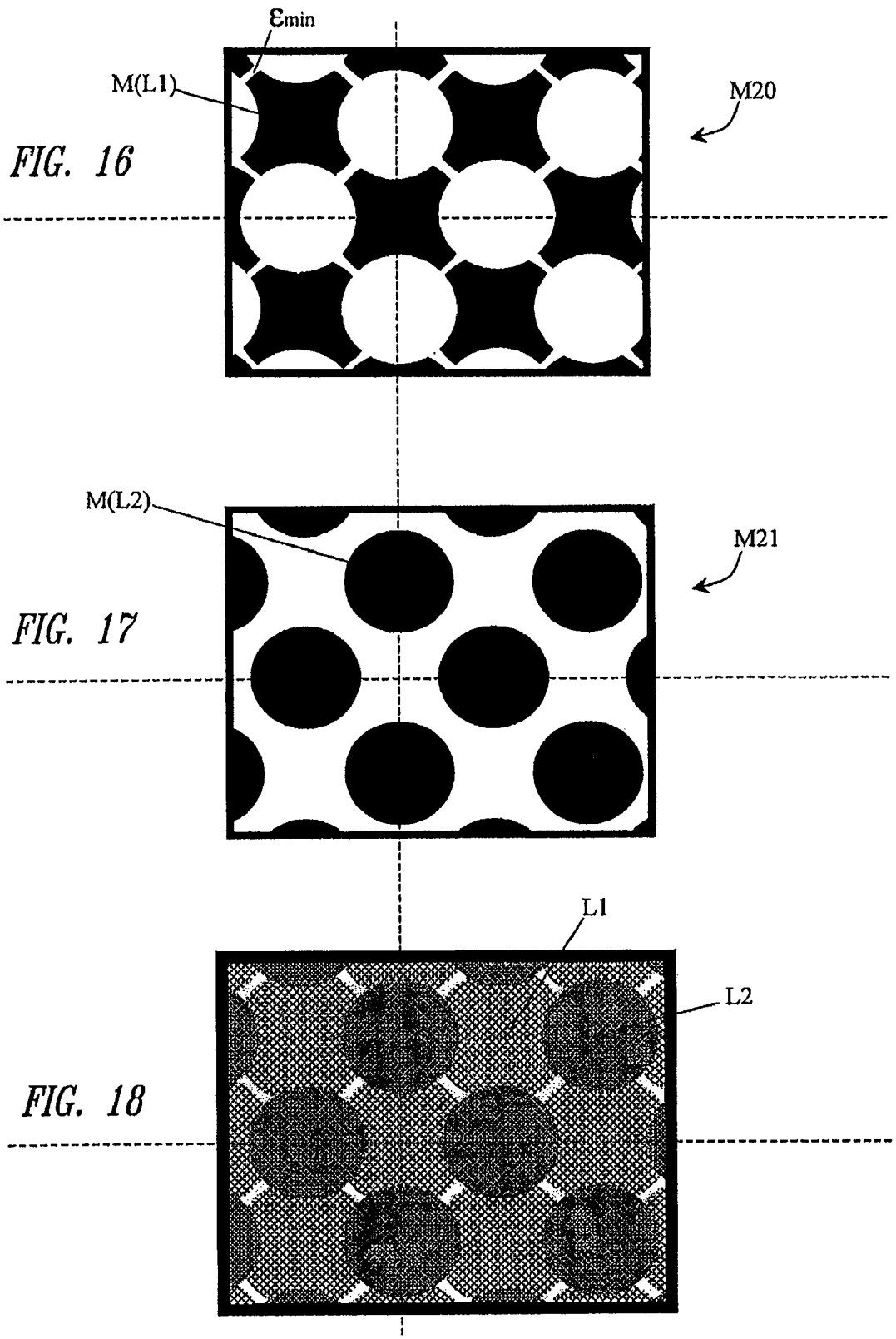
FIG. 18 is a top view of a microlens array made according to the second method.

This method differs from the method 1 in that the microlenses L1 and the microlenses L2 are manufactured by means of two layers of resin 21, 22, and two insulation masks M20 and M21 shown in FIGS. 16 and 17 (partial view). The mask M20 comprises dark areas M(L1) of octagonal shape with rounded edges which allow microlenses of L1 type to be manufactured in the first place. The mask M21 comprises dark areas M(L2) of circular shape that allow microlenses of L2 type to be manufactured then.

Figure 15:
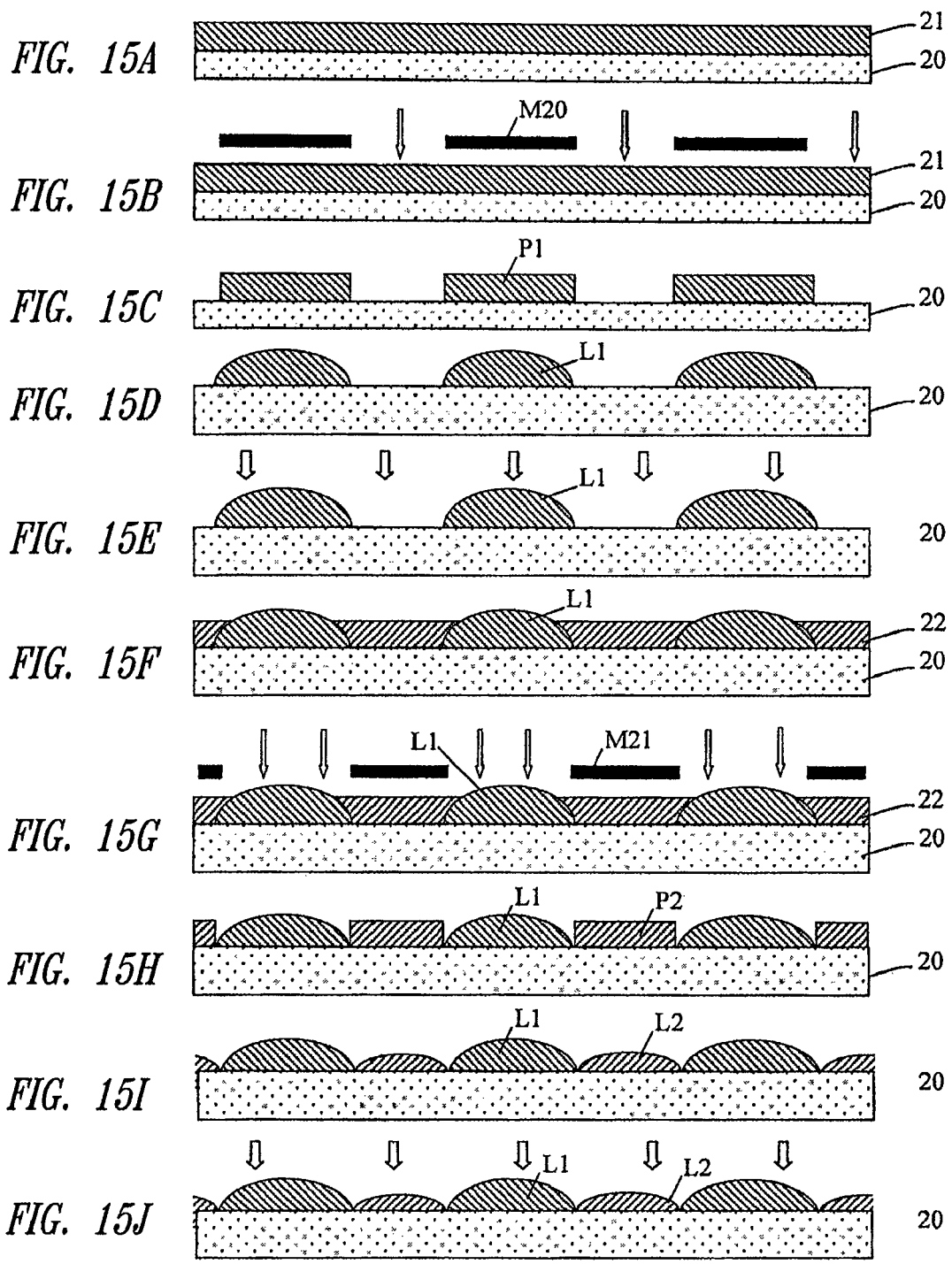
FIGS. 15A to 15J are cross-sectional views showing a second method for manufacturing the microlens array of FIG. 6, FIGS. 16 and 17 show insulation masks used by the second method.

More particularly, the method 2 comprises the following steps:
  depositing the layer of resin 21 on an imager wafer 20 and soft bake of the layer of resin 21, insulation of the layer of resin 21 through the mask M20,
removing the insulated parts from the layer of resin 21 to obtain resin pellets of a first type P1 (FIG. 15C),
thermal creep of the pellets to obtain microlenses of first type L1 (FIG. 15D),
hardening the microlenses L1 by afterbake (FIG. 15E),
depositing the layer of resin 22 on the imager wafer 20 and soft bake of the layer of resin 22 (FIG. 15F),
insulation of the layer of resin 22 through the mask M21 (FIG. 15G),
removing the insulated parts from the layer of resin 22, to obtain resin pellets of a second type P2 (FIG. 15H),
thermal creep of the pellets P2 to obtain the microlenses of second type L2 (FIG. 15I),
hardening the microlenses L2 (FIG. 15J).

The deposit of the layer of resin 22 is performed like the deposit of the layer 21, by centrifugation, the resin spreading by capillarity and under the effect of the centrifugal force in the regions without resin and spreading between the microlenses L1. The microlenses L1 are not attacked by the organic solvent during the etching of the layer of resin 22, because the afterbake process renders the resin resistant to the etching agent.

Therefore, the respective heights of the microlenses L1 and L2 are here adjusted in differentiated way, thanks to a corresponding control of the thickness of the layers of resin 21 and 22. The focal lengths of the microlenses L1 and L2 are thus more precisely controlled, so that they are equal or near.

As previously, the microlenses of L1 type are multifocal since the pellets P1 have, before creep, an octagonal outline with rounded edges given by the mask M20. As previously, the microlenses of L2 type are monofocal since the pellets P2 have, before creep, a circular outline given by the mask M21.

It is also worth noting the aforementioned advantage: the minimum distance ∈min between the edges of the adjacent microlenses of L1 type cannot be suppressed (Cf. mask M20 FIG. 16), but the distance between the edges of the adjacent microlenses of L1 type and of L2 type can be suppressed thanks to the etching process with two layers of resin and using two insulation masks. To that end, the dark areas M(L2) of the mask M21 should have an adapted diameter. The microlens array shown in FIG. 18 is thus obtained, in which the edges of the microlenses L1 are placed next to the edges of the microlenses L2, the fill factor being of about 96%.

Eventually, the layers of resin 21, 22 are preferably made with the same resin, and therefore have the same optical properties. However, in a variation that those skilled in the art may examine, resins with different optical indexes could be used so as to have more freedom for choosing the heights of microlenses.

Method 3, FIGS. 19A to 19J

This method comprises, like the method 2, depositing two layers of resin 21, 22. These layers are here made with identical resins, having same optical properties (index), for reasons that will appear hereinafter.

The method 3 differs from the method 2 in that the pellets P1 allowing the microlenses L1 to be made are not etched before creep to obtain the octagonal shape with rounded edges. These pellets are made with an insulation mask M30, shown in FIG. 20 (partial view), that comprises dark areas M(L1) having a circular outline. Thus, after creeping the pellets P1, monofocal microlenses L1 are obtained. In addition, the microlenses of L2 type are made with an insulation mask M31 shown in FIG. 21 (partial view) that is identical to the mask M21 of the method 2 (FIG. 17), and also have a circular outline. To obtain the octagonal shape with rounded edges that characterizes the microlenses L1 in top view, the microlenses L2 are formed with an overlap on the microlenses L1.

Figure 23:
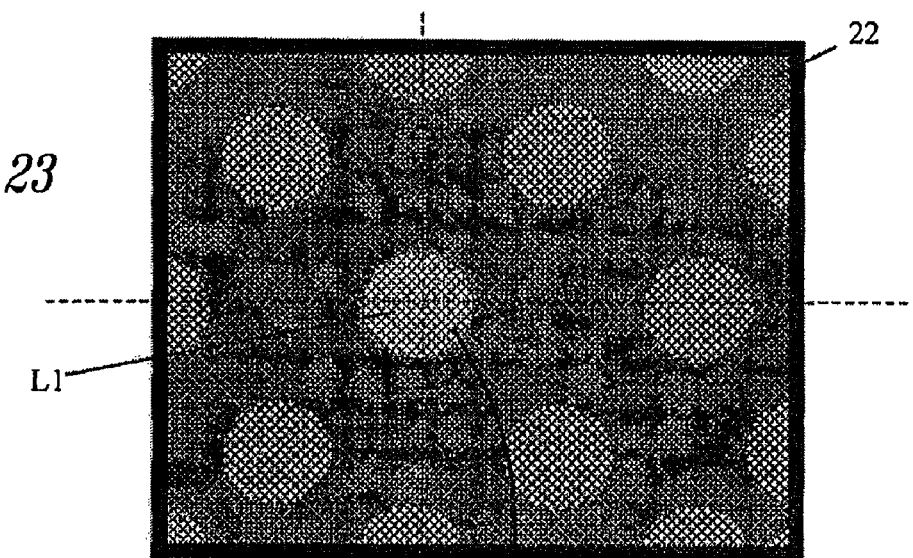
FIG. 23 is a top view corresponding to the cross-sectional view of FIG. 19F and shows microlenses in the process of being formed.
Figure 24:
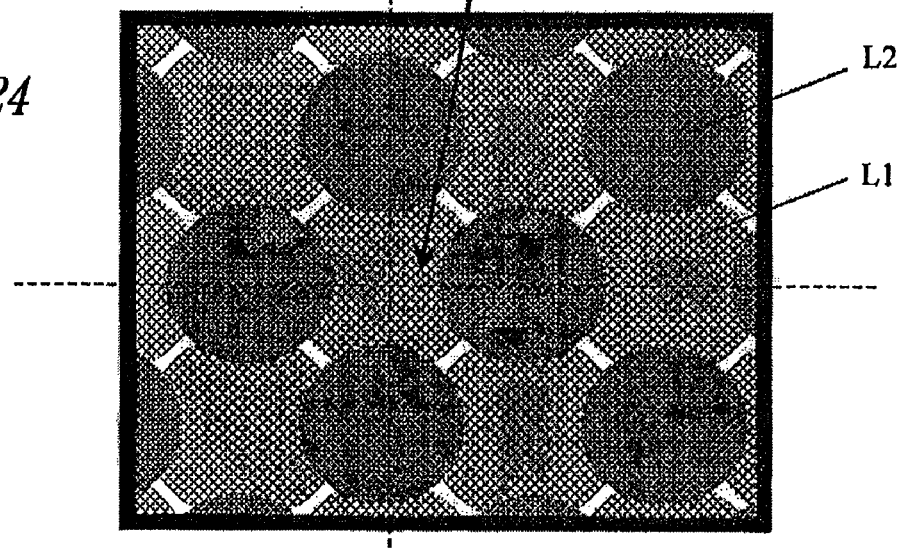
FIG. 24 is a top view of a microlens array made according to the third method.

More particularly, the method 3 comprises the following steps:
depositing the layer of resin 21 on an imager wafer 20 and soft bake of the layer of resin 21 (FIG. 19A),
insulation of the layer of resin 21 through the mask M30 (FIG. 19B),
removing the insulated parts from the layer of resin 21 to obtain resin pellets of P1 type here having a circular shape (FIG. 19C),
thermal creep of the pellets P1 to obtain monofocal microlenses of first type L1 (FIG. 19D),
hardening the microlenses L1 by afterbake (FIG. 19E),
depositing a layer of resin 22 on the imager wafer and soft bake of the layer of resin 22 (FIG. 19F),
insulation of the layer of resin 22 through the mask M31 (FIG. 19G),
removing the insulated parts from the layer of resin 22, to obtain resin pellets of P2 type which here cover the edges of the microlenses L1 (FIG. 19H),
thermal creep of the pellets P2 to obtain the microlenses of second type L2 (FIG. 19I),
hardening the microlenses L2 by afterbake (FIG. 19J), FIG. 23 is a top view of the microlens array in the course of formation, after depositing the layer of resin 22 and before etching the same (step shown in FIG. 19F). The microlenses L1 are partially covered by the layer of resin 22 and only the tops of the microlenses emerge from the layer 22. After etching the layer of resin 22, and creeping the pellets P2, the microlens array shown in FIG. 24 is obtained which is identical, in top view, to the array obtained with the method 2 (FIG. 18).

Figure 22:
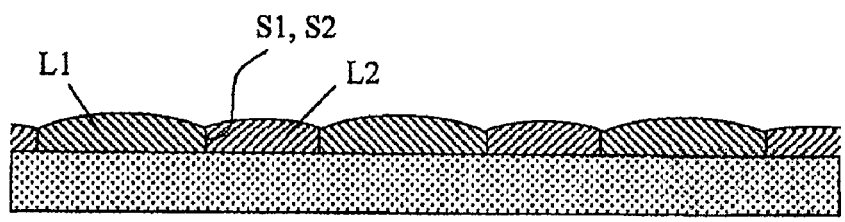
FIG. 22 is an equivalent diagram of a microlens array made according to the third method, in cross-sectional view.

The cross-sectional view of FIG. 22 is an equivalent diagram (at an optical level) of the microlens array shown in FIG. 19I or 19J, according to a section axis corresponding to the smallest diameter of the microlenses L1 (that is, an axis passing through the overlap areas). This equivalent diagram shows that the overlap of the microlenses L1 by the microlenses L2 does not modify the optical properties of the microlenses, if they are made of the same resin. More precisely, this equivalent diagram shows microlenses L1 and L2 arranged side by side without space and with parallel vertical edges S1, S2. In other words, the resin of the microlenses L1 which is covered by the resin of the microlenses L2 is part of the microlenses L2 and not of the microlenses L1, from an optical point of view. Obviously, the vertical edges shown in FIG. 22 only concern the overlap areas: the convex upper face of the microlenses L1, L2 has a profile in an arc of a circle that goes up to the base of the microlenses in the areas without overlap.

Those skilled in the art will note that because of the overlap areas, the active surface of the microlenses L2 is substantially diminished in relation to the theoretical active surface corresponding to the template G2. Conversely, the active surface of the microlenses L1 is substantially increased in relation to the theoretical active surface corresponding to the surface of the template G1 minus the surface of the overlap areas with the template G2. Thus, the templates G1, G2 are corrected in relation to the theoretical model at the time of their design, so as to take into account the variations of active surface due to the overlap areas.

Figure 25:
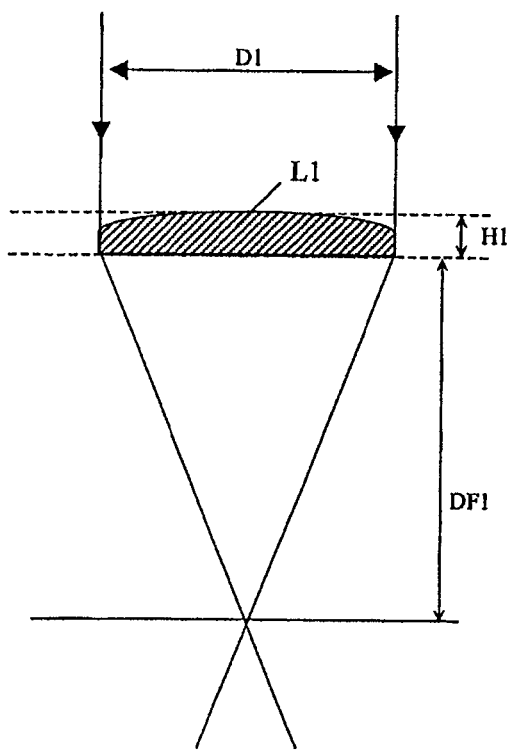
FIG. 25 shows optical properties of a microlens of first type made according to the third method.
Figure 26:
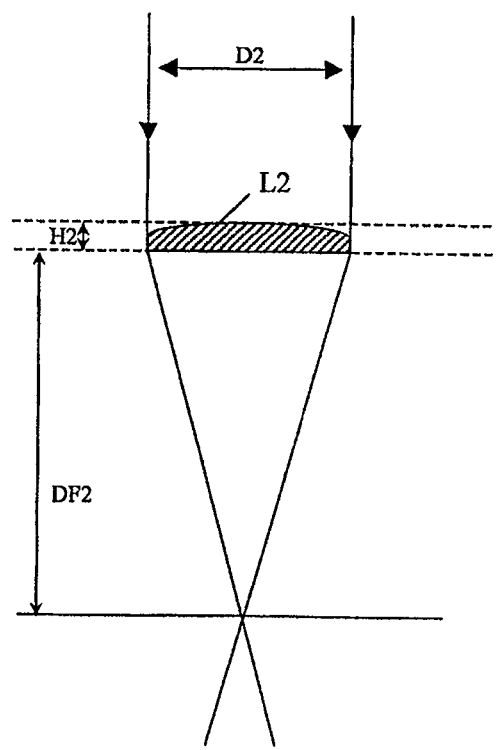
FIG. 26 shows optical properties of a microlens of second type made according to the third method.

FIGS. 25 and 26 respectively show the microlenses L1 and L2 in cross-sectional view according to the section axis of smallest diameter of the microlenses L1 and L2, as well as the respective focal lengths DF1 and DF2 of these microlenses, which vary with their heights H1 and H2. Here, the microlenses L1 are monofocal and their focal length DF1 is preferably equal, if not near, to the focal length DF2 of the microlenses L2.

Figure 27A:
FIGS. 27A to 27O are cross-sectional views showing a fourth method for manufacturing the microlens array of FIG. 6, FIGS. 28, 29, 30 show insulation masks used by the fourth method.
Figure 27B:
Figure 27C:
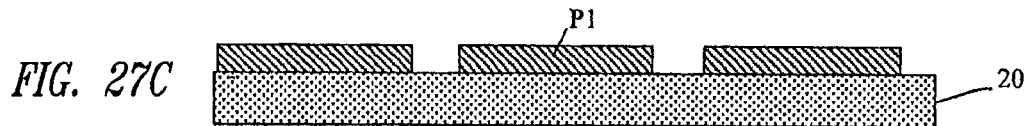
Figure 27D:
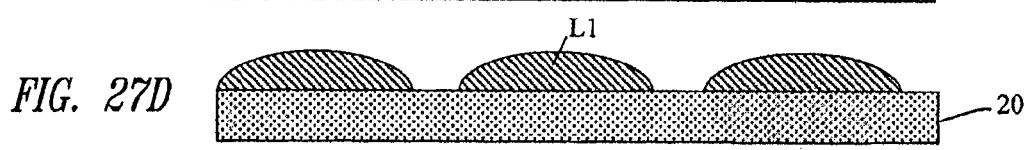
Figure 27E:
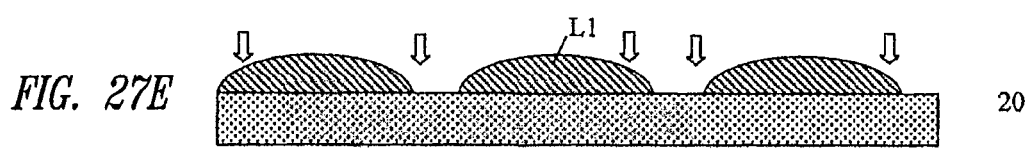
Figure 27F:
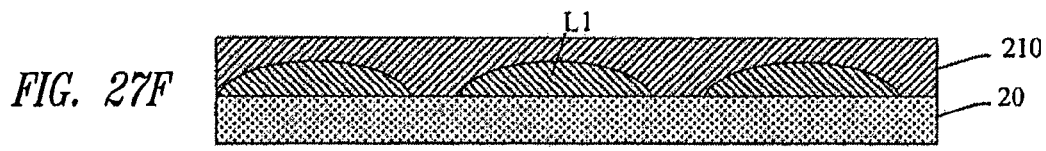
Figure 27G:
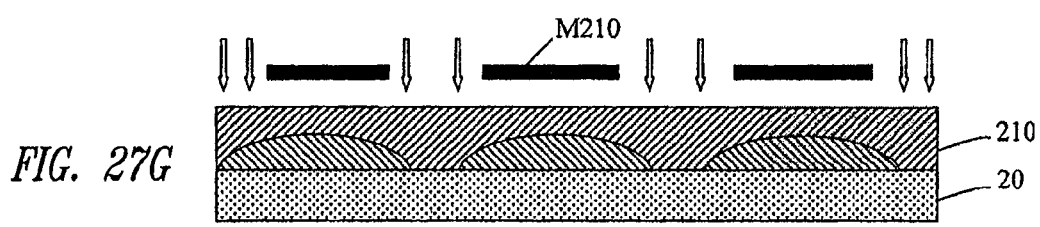
Figure 27H:
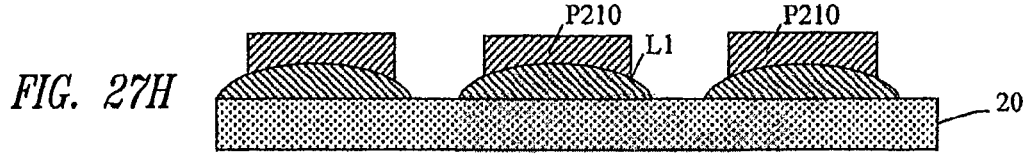
Figure 27I:
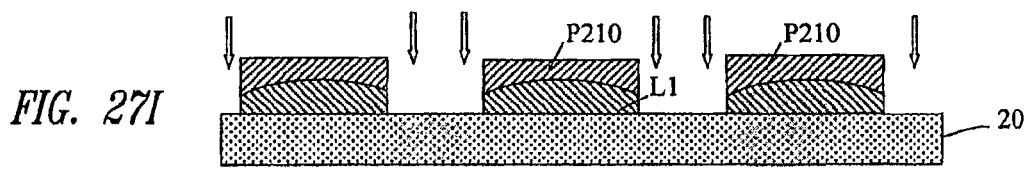
Figure 27J:
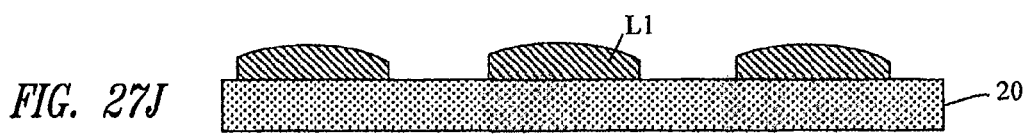
Figure 27K:
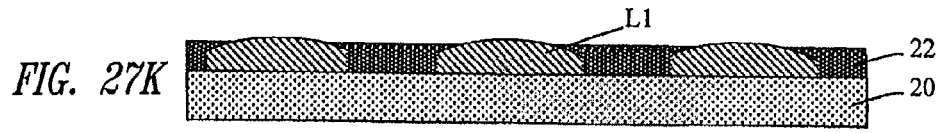
Figure 27L:
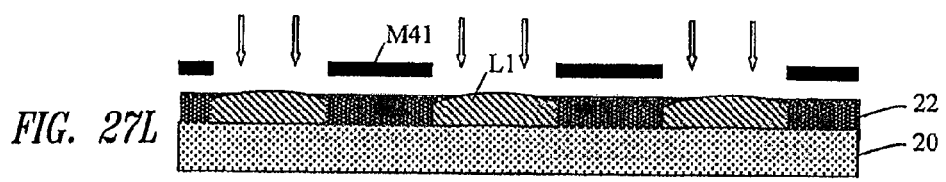
Figure 27M:
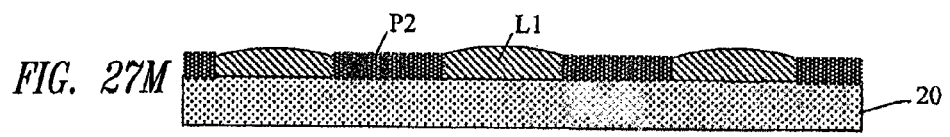
Figure 27N:
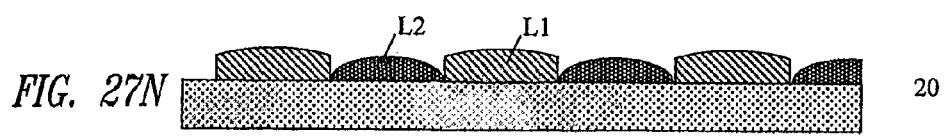
Figure 27O:
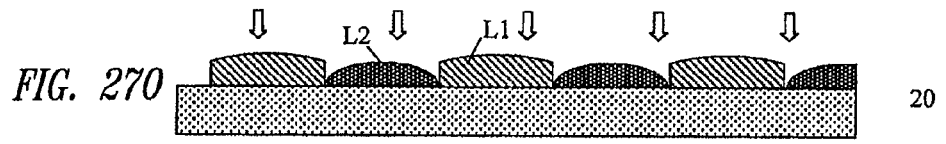

Method 4, FIGS. 27A to 27O

Figures 28, 29, 30:
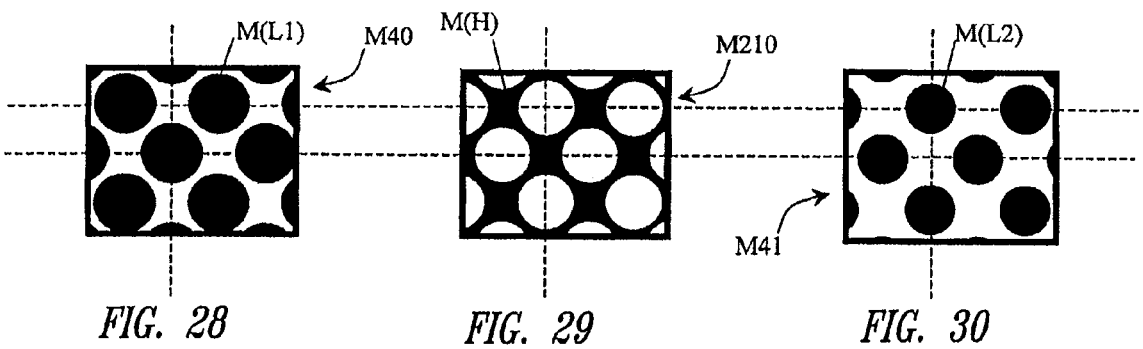

The method 4 varies from the method 3 in that three layers of resin 21, 210, 22 as well as three insulation masks M40, M210, M41 shown in FIGS. 28, 29, 30 are used. The layer of resin 210 is a temporary layer etched using the mask M210 to form an etching mask P210 which is suppressed after being used. This etching mask allows the microlenses L1 to be etched by means of a gaseous plasma, to give to the base of the microlenses L1 the octagonal shape with rounded edges. The mask M210 thus comprises, as shown in FIG. 29, dark areas M(H) of octagonal shape with rounded edges.

The mask M40 is used to etch the layer of resin 21 and is identical to the mask M30 of the method 3. Pellets P1 with a circular outline are thus obtained and the microlenses L1 obtained are monofocal, although being then processed by plasma etching to have an octagonal shape with rounded edges. The mask M41 is used likewise to etch the layer of resin 22 and make the microlenses L2, and is identical to the mask M31 of the method 3.

The method 4 more particularly comprises the following steps:
  depositing the layer of resin 21 on an imager wafer 20 and soft bake of the layer of resin 21 (FIG. 27A),
  insulation of the layer of resin 21 through the insulation mask M40 (FIG. 27B),
  removing the insulated parts from the layer of resin 21 to obtain the resin pellets P1 with circular outline (FIG. 27C),
  thermal creep of the pellets P1 to obtain monofocal microlenses L1 with a circular base (FIG. 27D),
  hardening the microlenses L1 by afterbake (FIG. 27E),
  depositing the masking layer of resin 210 on the imager wafer and soft bake of the layer of resin (FIG. 27F),
  insulation of the layer of resin 210 through the insulation mask M210 (FIG. 27G),
  removing the insulated parts from the layer 210, to obtain the etching mask in resin P210 which is the image of the insulation mask M210 and comprises areas of octagonal shape with rounded edges which cover the microlenses L1 (FIG. 27H, and FIG. 29: shape of the insulation mask M210),
  plasma etching of the microlenses L1 through the etching mask in resin P210, so that the microlenses L1 have an octagonal shape with rounded edges (FIG. 27I),
  using an organic solvent, removing remainders of the etching mask in resin (FIG. 27J) (a part of the thickness of the etching mask being destroyed during plasma etching),
  depositing the layer of resin 22 on the imager wafer and soft bake of the layer of resin 22 (FIG. 27K),
  insulation of the layer of resin 22 through the insulation mask M41 (FIG. 27L),
  removing the insulated parts from the layer 22, to obtain resin pellets P2 (FIG. 27M),
  thermal creep of the pellets P2 to obtain the microlenses L2 (FIG. 27N), and
  hardening the microlenses by afterbake (FIG. 27O).

Figure 31:
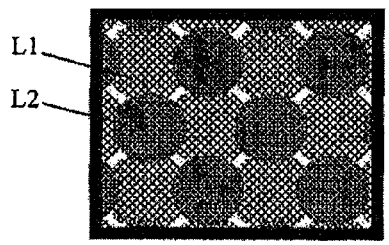
FIG. 31 is a top view of a microlens array made according to the fourth method.

The plasma etching in FIGS. 27J to 27O gives the microlenses L1 right vertical sides in the overlap areas of the templates G1, G2. The microlens array in top view is identical to the array obtained with the methods 2 and 3, as shown in FIG. 31.

FIGS. 32 and 33 respectively show the microlenses L1 and L2 in cross-sectional view according to the section axis of smallest diameter of the microlenses L1 and also showing the focal lengths DF1 and DF2 of the microlenses L1 and L2, which vary with their heights H1 and H2. Like in the method 3, the microlenses L1 are monofocal and their focal length DF1 is preferably equal, if not near, to the focal length DF2 of the microlenses L2.

Figure 34:
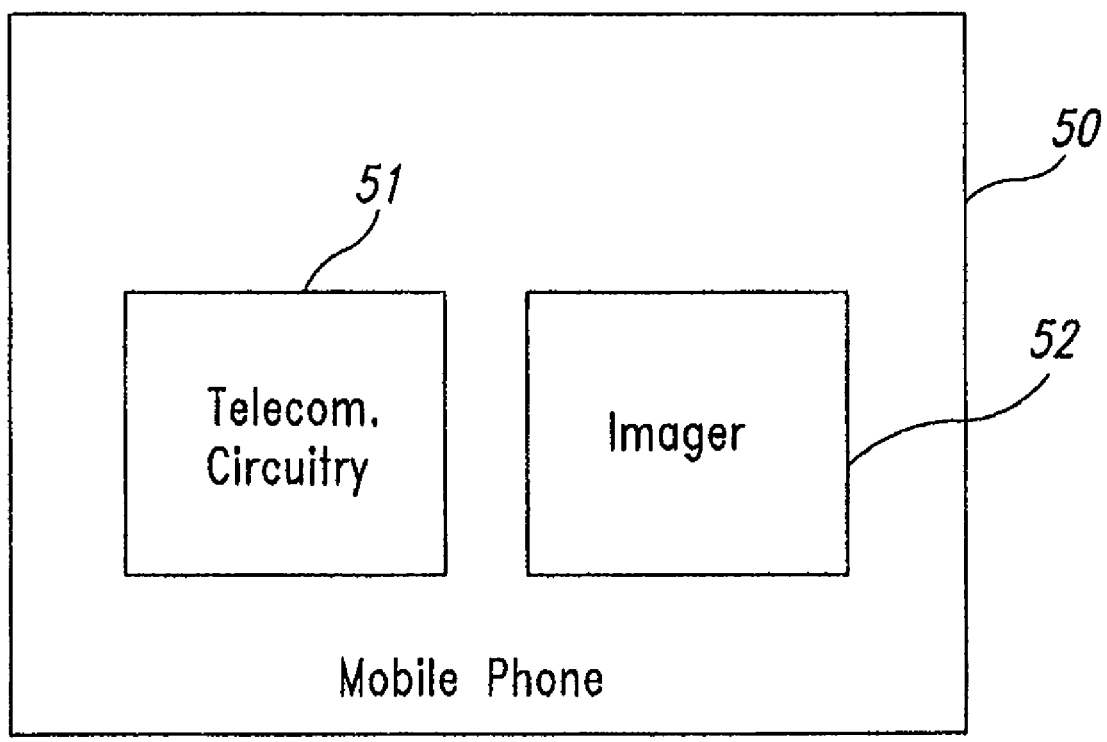
FIG. 34 shows a schematic of a portable device, according to one embodiment.

FIG. 34 shows a schematic of a portable device 50, according to one embodiment. The portable device 50 may be any device that utilizes video imaging, such as a mobile phone, a camera or a video camera, for example. As illustrated, the portable device 50 is a mobile phone that includes telecommunications circuitry 51 and a CMOS imager 52, according to an embodiment of the invention. For example, CMOS imager 52 comprises a microlens array (or a combination of two or more microlens arrays) formed on an imager wafer according to embodiments illustrated in FIG. 10, FIG. 18, FIG. 24 and FIG. 31.

It will clearly appear to those skilled in the art that various other embodiments of these methods can be provided, and that a microlens array can also be manufactured with other methods for depositing and forming microlenses.

The structure of a microlens array according to the invention itself is susceptible of modifications, particularly according to the distribution of photosites at the surface of the imager. For example, some imagers have a greater density of photosites at the center or on the edges, to take photographs with constant pixel density using a "fisheye" lens (wide-angle lens that can reach 180°). In that case, the areas of the imager having a lower density of photosites can be covered with a conventional structure of microlens array, and the areas having a greater density of photosites can be covered with a structure of microlens array according to the invention. A hybrid microlens array is obtained that comprises a distribution different from the microlenses of L1 type and L2 type according to the areas of the array. Any other combination of microlenses L1, L2 can also be provided, for example a combination L2-L2/L1/L2-L2, a combination L1-L1/L2-L2-L2/L1-L1, etc. (the sign "/" indicating the presence of an overlap area, and "-" the absence of an overlap area).

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A CMOS imager comprising:
  a photosite array; and
  a microlens array comprising first microlenses and second microlenses, the first and second microlenses being alternately distributed according to a constant pitch, the second microlenses each having a circular edge, wherein:
  each first microlens is surrounded by four adjacent second microlenses and has an active surface with rounded edges including four positive rounded edges with positive curve and four negative rounded edges with negative curve, the four positive rounded edges of the first microlens being four arcs of a circle having a first radius that is larger than a second radius of the circular edge of each second microlens, and the four negative rounded edges of the first microlens being defined by respective arcs of the circular edges of the four adjacent second microlenses that surround the first microlens, and the second microlenses have active surfaces with surface areas that are substantially equal to surface areas of the active surfaces of the first microlenses.

2. The imager according to claim 1, wherein the second microlenses cover base areas of the first microlenses adjacent to the negative rounded edges.

3. The imager according to claim 1, wherein the first microlenses are multifocal, with active surface having plural curves, and the second microlenses are monofocal.

4. The imager according to claim 1, wherein the first and second microlenses are monofocal.

5. The imager according to claim 1, wherein the second microlenses do not cover the first microlenses and each of the negative rounded edges of each first microlens is separated from an adjacent one of the second microlenses by a separation distance equal to a separation distance between adjacent edges of the first microlenses.

6. The imager according to claim 1, wherein the second microlenses do not cover the first microlenses and each of the negative rounded edges of each first microlens is separated from an adjacent one of the second microlenses by a separation distance equal to zero or lower than a separation distance between nearest edges of two first microlenses.

7. The imager according to claim 1 wherein the first radius is equal to a value R1 complying with the following equation:

$$R1 = \tfrac{1}{2}(\sqrt{2} \ast Pch - \in)$$

where Pch is the pitch and $\in$ is a separation distance between edges of two adjacent first microlenses.

8. A method, comprising:
manufacturing a CMOS imager, the manufacturing including:
forming a photosite array; and
forming a microlens array comprising first microlenses and second microlenses, the first and second microlenses being alternately distributed according to a constant pitch, the second microlenses each having a circular edge, wherein:
each first microlens is surrounded by four adjacent second microlenses and has an active surface with rounded edges including four positive rounded edges with positive curve and four negative rounded edges with negative curve, the four positive rounded edges of the first microlens being four arcs of a circle having a first radius that is larger than a second radius of the circular edge of each second microlens, and the four negative rounded edges of the first microlens being defined by respective arcs of the circular edges of the four adjacent second microlenses that surround the first microlens, and
the second microlenses have active surfaces with surface areas that are substantially equal to surface areas of the active surfaces of the first microlenses.

9. The method according to claim 8 wherein forming the microlens array includes:
designing an architecture of the microlens array, the designing including providing a first circular template having the first radius and a second circular template having the second radius, wherein the first and second templates are defined so as to have overlap areas, the sum of the radiuses of the first and second templates being greater than the pitch of the array, manufacturing the first microlenses comprising depositing a first layer of resin, insulating the first layer of resin through a first insulation mask, and etching the first layer of resin, and
manufacturing the second microlenses comprising depositing a second layer of resin, insulating the second layer of resin through a second insulation mask, and etching the second layer of resin, wherein:
the insulating and etching are performed so that the edge of each second microlens is substantially delineated by the second circular template, and each of the first microlenses has a shape that substantially corresponds to the first circular template minus the overlap areas.

10. The method according to claim 8, wherein:
the first microlenses are formed by manufacturing resin pellets having an octagonal outline with rounded edges, and creeping the pellets to obtain first microlenses, and
the second microlenses are formed by manufacturing resin pellets having a circular outline and creeping the pellets to obtain the second microlenses.

11. The method according to claim 8, wherein:
the first microlenses are formed by manufacturing resin pellets having a circular outline, creeping the pellets to obtain the first microlenses having a circular outline, and
the second microlenses are formed by manufacturing resin pellets having a circular outline and covering areas of the first microlenses adjacent to the negative edges, and creeping the pellets to obtain the second microlenses.

12. The method according to claim 8, wherein:
the first microlenses are formed by manufacturing first resin pellets having an octagonal outline with rounded edges, and creeping the pellets to obtain the first microlenses, and
the second microlenses are formed by manufacturing second resin pellets having a circular outline and creeping the pellets to obtain the second microlenses,
the first and second resin pellets being simultaneously manufactured by insulating a same layer of resin through a same insulation mask and simultaneously etching the first and second pellets.

13. The method according to claim 8, wherein:
the first microlenses of the first type are formed by manufacturing first resin pellets having a circular outline, creeping the pellets to obtain the first microlenses having a circular outline, and etching the first microlenses to have an octagonal base with rounded edges, and
the second microlenses are formed by manufacturing second resin pellets having a circular outline and creeping the pellets to obtain the second microlenses.

14. The method according to claim 13, wherein etching the first microlenses is performed using a gaseous plasma.

15. The method according to claim 14, wherein etching the first microlenses is performed through an etching mask formed by depositing a layer of masking resin onto the first resin pellets, insulating the layer of masking resin through an insulation mask, removing the insulated masking resin, to obtain the etching mask.

16. A portable device, comprising:
an imager including:
a photosite array; and
a microlens array comprising first microlenses and second microlenses, the first and second microlenses being alternately distributed according to a constant pitch, the second microlenses each having a circular edge, wherein:
each first microlens is surrounded by four adjacent second microlenses and has an active surface with rounded edges including four positive rounded edges with positive curve and four negative rounded edges with negative curve, the four positive rounded edges of the first microlens being four arcs of a circle having a first radius that is larger than a second radius of the circular edge of each second microlens, and the four negative rounded edges of the first microlens being defined by respective arcs of the circular edges of the four adjacent second microlenses that surround the first microlens, and the second microlenses have active surfaces with surface areas that are substantially equal to surface areas of the active surfaces of the first microlenses.

17. The portable device of claim 16 in which the portable device is a mobile phone that includes telecommunications circuitry coupled to the imager.

18. The portable device of claim 16, wherein the second microlenses cover base areas of the first microlenses adjacent to the negative rounded edges.

19. The portable device of claim 16, wherein the first microlenses are multifocal, with active surface having plural curves, and the second microlenses are monofocal.

20. The portable device of claim 16, wherein the first and second microlenses are monofocal.

21. The portable device of claim 16, wherein the second microlenses do not cover the first microlenses and each of the negative rounded edges of each first microlens is separated from an adjacent one of the second microlenses by a separation distance equal to a separation distance between adjacent edges of the first microlenses.

22. The portable device of claim 16, wherein the second microlenses do not cover the first microlenses and each of the negative rounded edges of each first microlens is separated from an adjacent one of the second microlenses by a separation distance equal to zero or lower than a separation distance between nearest edges of two first microlenses.

23. The portable device of claim 16 wherein the first radius is equal to a value R1 complying with the following equation:

$$R1 = \tfrac{1}{2}(\sqrt{2}*Pch - \in)$$

where Pch is the pitch and $\in$ is a separation distance between edges of two adjacent first microlenses.

* * * * *

UNITED STATES PATENT AND TRADEMARK OFFICE
CERTIFICATE OF CORRECTION

PATENT NO. : 7,842,909 B2  
APPLICATION NO. : 12/129096  
DATED : November 30, 2010  
INVENTOR(S) : Brendan Dunne et al.

It is certified that error appears in the above-identified patent and that said Letters Patent is hereby corrected as shown below:

On the Title Page:  
Item (73) Assignee:  
"STMicroelectronics Rousset SAS, Rousset (FR)" should read as, --STMicroelectronics Rousset SAS, Rousset (FR); Universite Paul Cezanne Aix Marseille III, Aix en Provence cedex 1 (FR)--.

Signed and Sealed this  
Twenty-sixth Day of July, 2011

David J. Kappos  
*Director of the United States Patent and Trademark Office*